(12) United States Patent
Wong et al.

(10) Patent No.: US 11,756,828 B2
(45) Date of Patent: Sep. 12, 2023

(54) CLUSTER PROCESSING SYSTEM FOR FORMING A TRANSITION METAL MATERIAL

(71) Applicant: Applied Materials, Inc., Santa Clara, CA (US)

(72) Inventors: Keith Tatseun Wong, Los Gatos, CA (US); Srinivas D. Nemani, Sunnyvale, CA (US); Ellie Y. Yieh, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/197,048

(22) Filed: Nov. 20, 2018

(65) Prior Publication Data
US 2020/0161176 A1    May 21, 2020

(51) Int. Cl.
*H01L 21/768*    (2006.01)
*H01L 23/532*    (2006.01)
*H01L 21/285*    (2006.01)

(52) U.S. Cl.
CPC .. *H01L 21/76834* (2013.01); *H01L 21/28562* (2013.01); *H01L 21/76832* (2013.01); *H01L 23/5329* (2013.01)

(58) Field of Classification Search
CPC ......... H01L 21/76832; H01L 21/76834; H01L 21/67161; H01L 21/67167; H01L 21/67173; H01L 21/67178; H01L 21/67184; H01L 21/6719; H01L 21/67196; H01L 21/67201; H01L 21/67207
See application file for complete search history.

(56) References Cited

U.S. PATENT DOCUMENTS

| | | | |
|---|---|---|---|
| 6,518,167 B1 | 2/2003 | You et al. |
| 7,074,708 B2 | 7/2006 | Gaillard et al. |
| 7,205,223 B2 | 4/2007 | McTeer |
| 7,563,704 B2 | 7/2009 | Yang et al. |

(Continued)

FOREIGN PATENT DOCUMENTS

| | | | |
|---|---|---|---|
| TW | 201517129 A | 5/2015 |
| TW | I615496 B | 2/2018 |

OTHER PUBLICATIONS

PCT Notification of Transmittal of the International Search Report and the Written Opinion of the International Searching Authority for International Application No. PCT/US2019/056789; dated Mar. 25, 2020; 11 total pages.

(Continued)

*Primary Examiner* — Suberr L Chi
(74) *Attorney, Agent, or Firm* — Patterson + Sheridan, LLP

(57) ABSTRACT

Methods for forming a transition metal material on a substrate and thermal processing such metal containing material in a cluster processing system are provided. In one embodiment, a method for a device structure for semiconductor devices includes forming a two-dimensional transition metal dichalcogenide layer on a substrate in a first processing chamber disposed in a cluster processing system, thermally treating the two-dimensional transition metal dichalcogenide layer to form a treated metal layer in a second processing chamber disposed in the cluster processing system, and forming a capping layer on the treated metal layer in a third processing chamber disposed in the cluster processing system.

13 Claims, 7 Drawing Sheets

(56) References Cited

U.S. PATENT DOCUMENTS

| | | | |
|---|---|---|---|
| 9,879,341 B2 | 1/2018 | Singh et al. | |
| 2006/0210723 A1 | 9/2006 | Ishizaka | |
| 2015/0079803 A1* | 3/2015 | Huang | H01L 21/02378 |
| | | | 438/758 |
| 2015/0348902 A1 | 12/2015 | Naik et al. | |
| 2016/0093491 A1* | 3/2016 | Choi | H01L 29/78681 |
| | | | 438/479 |
| 2016/0141427 A1 | 5/2016 | Chen et al. | |
| 2016/0372351 A1* | 12/2016 | Singh | H01L 21/6719 |
| 2017/0073812 A1* | 3/2017 | Sundaram | H01L 21/02568 |
| 2018/0105930 A1 | 4/2018 | Kang et al. | |
| 2020/0161129 A1* | 5/2020 | Mattinen | H01L 29/78681 |

OTHER PUBLICATIONS

Taiwan Office Action for Application No. 108140950 dated May 4, 2023.

\* cited by examiner

CLUSTER PROCESSING SYSTEM FOR FORMING A TRANSITION METAL MATERIAL

BACKGROUND OF THE DISCLOSURE

Field of the Disclosure

Embodiments of the present disclosure generally relate to methods for forming a metal containing material. More particularly, embodiments of the present disclosure generally relate to methods for forming a metal containing material for a device structure with minimum exposure to air during manufacturing for semiconductor devices to prevent excess oxidation.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

As the dimensions of the integrated circuit components are reduced (e.g., to deep sub-micron dimensions), the materials used to fabricate such components must be carefully selected in order to obtain satisfactory levels of electrical performance.

During the semiconductor manufacturing process, a surface of the metal line formed from the dielectric bulk insulating materials is exposed to air. Prior to the subsequent metallization process to form a device structure on the exposed metal, the substrate may be transferred among different vacuum environments to perform a different processing steps. During transfer, the substrate may have to reside outside the process chamber or controlled environment for a period of time called the queue time (Q-time). During the Q-time, the substrate is exposed to ambient environmental conditions that include oxygen and water at atmospheric pressure and room temperature. As a result, the substrate subjected to oxidizing conditions in the ambient environment may accumulate native oxides or contaminants on the metal surface prior to the subsequent metallization process or interconnection fabrication process.

Furthermore, poor adhesion at the interface, when interface native oxides are formed, may also result in undesired high contact resistance, thus resulting in undesirably poor electrical properties of the device. In addition, poor nucleation of the metal elements in the device structure may impact not only the electrical performance of the devices, but also on the integration of the conductive contact material subsequently formed thereon.

Recently, layered transition metal dichalcogenides are two-dimensional semiconducting materials often used in channel structures. Transition metal dichalcogenides exhibit properties such as a direct band gap, strong spin-orbit coupling, and a lack of an inversion center, that makes transition metal dichalcogenides desirable for electronics applications. Furthermore, transfer of the substrate with the transition metal dichalcogenides exposed often results in oxidation of the transition metal dichalcogenides, which eventually leads to undesired electrical performance of the device structures.

Thus, there remains a need in the art for an improved method of forming transition metal dichalcogenides on substrates with good interface quality control for metal exposure with minimum substrate oxidation.

SUMMARY

Methods for forming a metal containing material on a substrate and thermal processing such metal containing material in a cluster processing system are provided. In one embodiment, a method for a device structure for semiconductor devices includes forming a two-dimensional transition metal dichalcogenide layer on a substrate in a first processing chamber disposed in a cluster processing system, thermally treating the two-dimensional transition metal dichalcogenide layer to form a treated metal layer in a second processing chamber disposed in the cluster processing system, and forming a capping layer on the treated metal layer in a third processing chamber disposed in the cluster processing system.

In another embodiment, a method for a device structure for semiconductor devices includes performing a first deposition process on a substrate to form a two-dimensional transition metal dichalcogenide layer in a cluster processing system without breaking vacuum, performing a thermal treatment process on the two-dimensional transition metal dichalcogenide layer in the cluster processing system without breaking vacuum, and performing a second deposition process to form a capping layer on the the two-dimensional transition metal dichalcogenide layer in the cluster processing system without breaking vacuum.

In yet another embodiment, a cluster processing system includes a first deposition chamber configured to form a two-dimensional transition metal dichalcogenide layer, wherein the first deposition chamber is an atomic layer deposition chamber or a chemical vapor deposition chamber, an annealing chamber, a second deposition chamber, and a pre-cleaning chamber.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for forming a metal containing material on a substrate with good capping protection in a semiconductor device are provided. The metal containing material is a two-dimensional transition metal dichalcogenide containing material. A pre-cleaning process, the two-dimensional transition metal dichalcogenide deposition process, an annealing process, a capping layer deposition process can be all integratedly formed in a single cluster system with multiple types of the processing chambers incorporated thereto. By doing so, the metal containing material along with the capping layer formed thereon along with the annealing process may be formed in the cluster processing system without breaking vacuum (e.g., substrate without exposure to the atmosphere while in the cluster processing system) so that the likelihood of contamination and pollution from the air or from the environment can be eliminated. Furthermore, by timely forming a proper capping protection structure formed on a two-dimensional transition metal dichalcogenide material, the likelihood of electron migration, metal oxidation or the metal line eruption/diffusion may be eliminated, thus increasing manufacturing flexibility without degradation of device performance.

Figure 1:
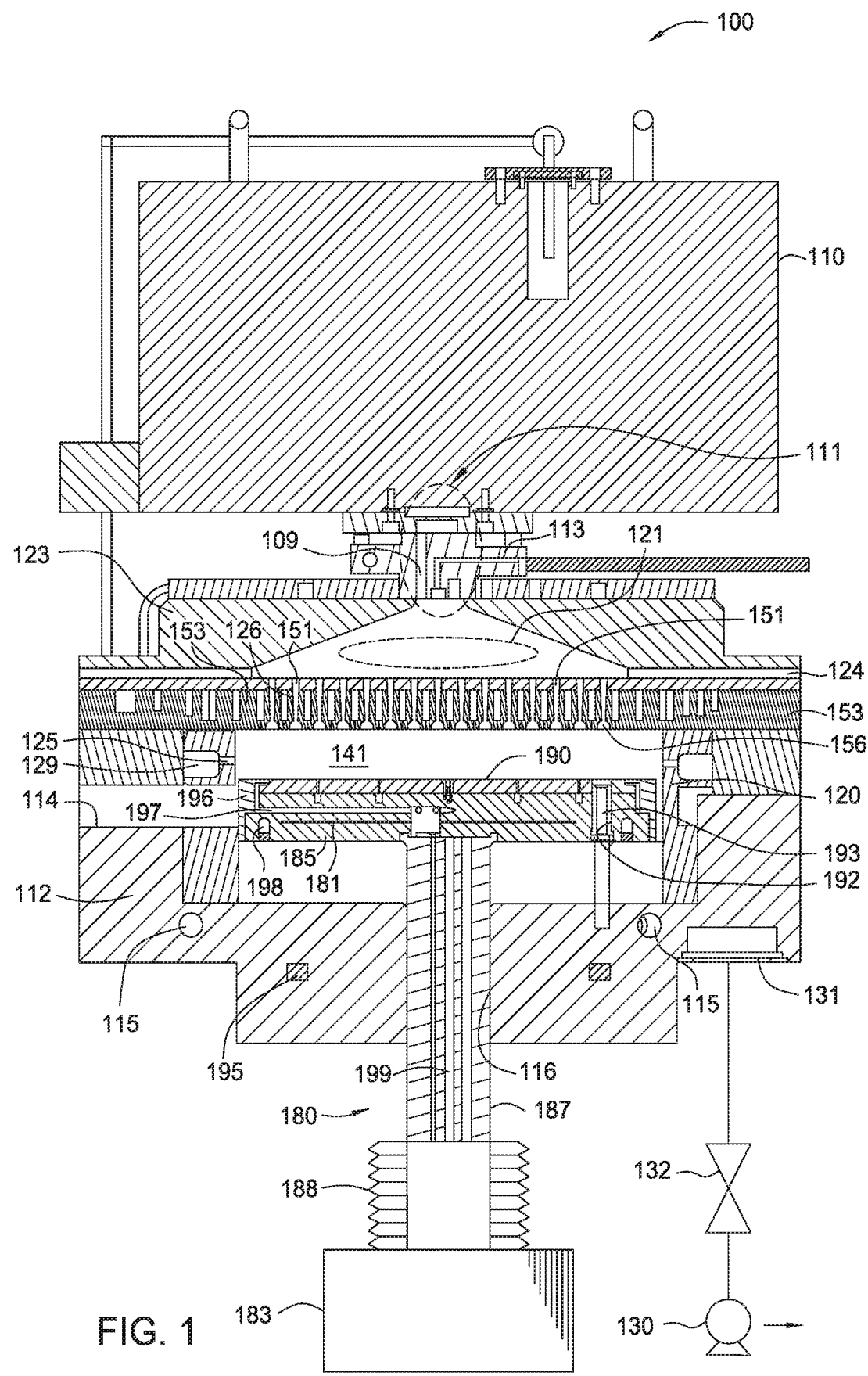
FIG. 1 depicts a pre-clean processing chamber which may be utilized to perform a pre-clean process on a substrate.

FIG. 1 is a cross sectional view of an illustrative processing chamber 100 suitable for performing a substrate pre-cleaning process as further described below. The processing chamber 100 may be configured to remove native oxide, or surface contamination from a substrate surface. The processing chamber 100 is particularly useful for performing the remote plasma surface cleaning process. The processing chamber 100 may be a Frontier™, PCxT Reactive Pre-clean™ (RPC), AKTIV Pre-Clean™, Siconi™ or Capa™ chamber, which is available from Applied Materials, Santa Clara, Calif. It is noted that other vacuum processing chambers available from other manufactures may also be adapted to practice the present disclosure.

The processing chamber 100 includes a chamber body 112, a lid assembly 123, and a support assembly 180. The lid assembly 123 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120.

A remote plasma system 110 may process a halogen containing precursor, for example fluorine-containing precursor, which then travels through a gas inlet assembly 111. Two distinct gas supply channels (a first channel 109 and a second channel 113) are visible within the gas inlet assembly 111. The first channel 109 carries a gas that passes through the remote plasma system 110 (RPS), while the second channel 113 bypasses the remote plasma system 110. Either channel 109, 113 may be used for the halogen-containing precursor. On the other hand, the first channel 109 may be used for the process gas and the second channel 113 may be used for a treatment gas. A lid assembly (or conductive top portion) 123 and a perforated partition 153 (or called a showerhead) are shown with an insulating ring 124 in between, which allows an AC potential to be applied to the lid assembly 123 relative to the perforated partition 153. The AC potential strikes a plasma in a chamber plasma region 121. The process gas may travel through the first channel 109 into the chamber plasma region 121 and may be excited by a plasma in the chamber plasma region 121 alone or in combination with the remote plasma system 110. If the process gas flows through the second channel 113, then only the chamber plasma region 121 is used for excitation. The combination of the chamber plasma region 121 and/or the remote plasma system 110 may be referred to as a remote plasma system herein. The perforated partition (also referred to as a showerhead) 153 separates the chamber plasma region 121 from a substrate processing region 141 beneath the perforated partition 153. The perforated partition 153 allows a plasma present in the chamber plasma region 121 to avoid directly exciting gases in the substrate processing region 141, while still allowing excited species to travel from the chamber plasma region 121 into the substrate processing region 141.

The perforated partition 153 is positioned between the chamber plasma region 121 and the substrate processing region 141 and allows plasma effluents (excited derivatives of precursors or other gases) created within remote plasma system 110 and/or the chamber plasma region 121 to pass through a plurality of through-holes 156. The perforated partition 153 also has one or more hollow volumes 151 which can be filled with a precursor in the form of a vapor or gas and pass through the through-holes 156 into the substrate processing region 141 but not directly into the chamber plasma region 121. In order to maintain a significant concentration of excited species penetrating from the chamber plasma region 121 to the substrate processing region 141, the length 126 of the through-holes 156 may be restricted and configured in different configurations as needed.

The perforated partition 153 may be configured to serve the purpose of an ion suppressor as shown in FIG. 1. Alternatively, a separate processing chamber element may be included (not shown) which suppresses the ion concentration traveling into the substrate processing region 141. The lid assembly 123 and the perforated partition 153 may function as a first electrode and second electrode, respectively, so that the lid assembly 123 and the perforated partition 153 may receive different electric voltages. In these configurations, electrical power (e.g., RF power) may be applied to the lid 123, the perforated partition 153, or both. For example, the electrical power may be applied to the lid assembly 123 while the perforated partition 153 (serving as ion suppressor) is grounded. The substrate processing chamber 100 may include a RF generator that provides the electrical power to the lid assembly 123 and/or the perforated partition 153 as needed. The voltage applied to the lid assembly 123 may facilitate a uniform distribution of plasma (i.e., reduce localized plasma) within the chamber plasma region 121. To enable the formation of a plasma in the chamber plasma region 121, the insulating ring 124 may electrically insulate the lid assembly 123 from the perforated partition 153. The insulating ring 124 may be made from a ceramic and may have a high breakdown voltage to avoid sparking. Portions of substrate processing chamber 100 near the capacitively-coupled plasma components just described may further include a cooling unit (not shown) that includes one or more cooling fluid channels to cool surfaces exposed to the plasma with a circulating coolant (e.g., water).

In the embodiment shown, the perforated partition 153 may distribute (via through-holes 156) process gases which contain hydrogen, fluorine and/or plasma effluents of such process gases upon excitation by a plasma in the chamber plasma region 121. In embodiments, the process gas introduced into the remote plasma system 110 and/or the chamber plasma region 121 may contain fluorine (such as $F_2$ or HF). The process gas may also include a carrier gas such as helium, argon, hydrogen ($H_2$), etc. Plasma effluents may include ionized or neutral derivatives of the process gas and may also be referred to herein as radical-fluorine referring to the atomic constituent of the process gas introduced.

The through-holes 156 are configured to suppress the migration of ionically-charged species out of the chamber plasma region 121 while allowing uncharged neutral or radical species to pass through the perforated partition 153 into the substrate processing region 141. These uncharged species may include highly reactive species that are transported with less-reactive carrier gas by the through-holes 156. As noted above, the migration of ionic species by the through-holes 156 may be reduced, and in some instances completely suppressed. Controlling the amount of ionic species passing through the perforated partition 153 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., silicon nitride/oxide:silicon etch ratios).

In embodiments, the number of the through-holes 156 may be between about 60 and about 2000. The through-holes 156 may have a variety of shapes but are most easily made round. There is also latitude in choosing the cross-sectional shape of through-holes, which may be made conical, cylindrical or combinations of the two shapes. The through-holes 156 may be configured to control the passage of the plasma-activated gas (i.e., the ionic, radical, and/or neutral species) through the perforated partition 153. For example, the aspect ratio of the holes (i.e., the hole diameter to length) and/or the geometry of the holes may be controlled so that the flow of ionically-charged species in the activated gas passing through the perforated partition 153 is reduced. The through-holes 156 in the perforated partition 153 may include a tapered portion that faces the chamber plasma region 121, and a cylindrical portion that faces the substrate processing region 141. The cylindrical portion may be proportioned and dimensioned to control the flow of ionic species passing into the substrate processing region 141. An adjustable electrical bias may also be applied to the perforated partition 153 as an additional means to control the flow of ionic species through the perforated partition 153.

Alternatively, the through-holes 156 may have a smaller inner diameter (ID) toward the top surface of the perforated partition 153 and a larger ID toward the bottom surface. In addition, the bottom edge of the through-holes 156 may be chamfered to help evenly distribute the plasma effluents in the substrate processing region 141 as the plasma effluents exit the showerhead and promote even distribution of the plasma effluents and precursor gases. The smaller ID may be placed at a variety of locations along the through-holes 156 and still allow the perforated partition 153 to reduce the ion density within the substrate processing region 141. The reduction in ion density results from an increase in the number of collisions with walls prior to entry into the substrate processing region 141. Each collision increases the probability that an ion is neutralized by the acquisition or loss of an electron from the wall. Generally speaking, the smaller ID of the through-holes 156 may be between about 0.2 mm and about 20 mm. In other embodiments, the smaller ID may be between about 1 mm and 6 mm or between about 0.2 mm and about 5 mm. Further, aspect ratios of the through-holes 156 (i.e., the smaller ID to hole length) may be approximately 1 to 20. The smaller ID of the through-holes 156 may be the minimum ID found along the length of the through-holes. The cross sectional shape of through-holes 156 may be generally cylindrical, conical, or any combination thereof.

The support assembly 180 can include a support member 185 to support a substrate (not shown in FIG. 1) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within processing chamber 100.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
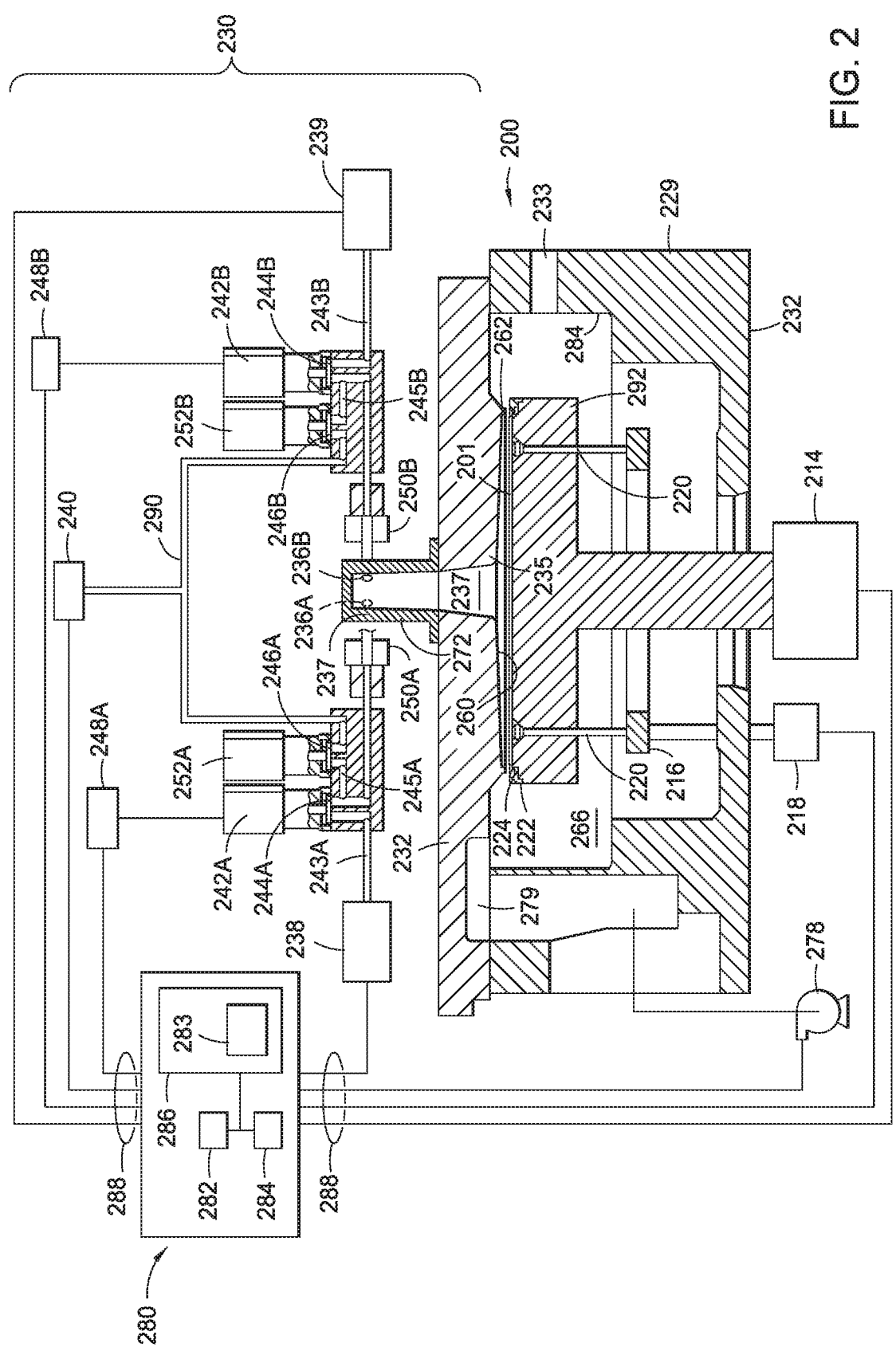
FIG. 2 depict an apparatus that may be utilized to perform an atomic layer deposition (ALD) processing process in accordance with one embodiment of the present disclosure.

FIG. 2 is a schematic cross-sectional view of one embodiment of an atomic layer deposition (ALD) processing chamber 200. The ALD processing chamber 200 includes a gas delivery apparatus 230 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 200 may also be adapted for other deposition techniques along with lithography process.

The chamber 200 comprises a chamber body 229 having a bottom 232. A slit valve tunnel 233 formed through the chamber body 229 provides access for a robot (not shown) to deliver and retrieve a substrate 201, such as a 200 mm, 300 mm or 450 mm semiconductor substrate or a glass substrate, from the chamber 200.

A substrate support 292 is disposed in the chamber 200 and supports the substrate 201 during processing. The substrate support 292 is mounted to a lift 214 to raise and lower the substrate support 292 and the substrate 201 disposed thereon. A lift plate 216 is connected to a lift plate actuator 218 that controls the elevation of the lift plate 216. The lift plate 216 may be raised and lowered to raise and lower pins 220 movably disposed through the substrate support 292. The pins 220 are utilized to raise and lower the substrate 201 over the surface of the substrate support 292. The substrate support 292 may include a vacuum chuck, an electrostatic chuck, or a clamp ring for securing the substrate 201 to the surface of the substrate support 292 during processing.

The substrate support 292 may be heated to heat the substrate 201 disposed thereon. For example, the substrate support 292 may be heated using an embedded heating element, such as a resistive heater, or may be heated using radiant heat, such as heating lamps disposed above the substrate support 292. A purge ring 222 may be disposed on the substrate support 292 to define a purge channel 224 which provides a purge gas to a peripheral portion of the substrate 201 to prevent deposition thereon.

A gas delivery apparatus 230 is disposed at an upper portion of the chamber body 229 to provide a gas, such as a process gas and/or a purge gas, to the chamber 200. A pumping system 278 is in communication with a pumping channel 279 to evacuate any desired gases from the chamber 200 and to help maintain a desired pressure or a desired pressure range inside a pumping zone 166 of the chamber 200.

In one embodiment, the gas delivery apparatus 230 comprises a chamber lid 232. The chamber lid 232 includes an expanding channel 237 extending from a central portion of the chamber lid 232 and a bottom surface 260 extending from the expanding channel 237 to a peripheral portion of the chamber lid 232. The bottom surface 260 is sized and shaped to substantially cover the substrate 201 disposed on the substrate support 292. The chamber lid 232 may have a choke 262 at a peripheral portion of the chamber lid 232 adjacent the periphery of the substrate 201. The cap portion 272 includes a portion of the expanding channel 237 and gas inlets 236A, 236B. The expanding channel 237 has gas inlets 236A, 236B to provide gas flows from two similar valves 242A, 242B. The gas flows from the valves 242A, 242B may be provided together and/or separately.

In one configuration, valve 242A and valve 242B are coupled to separate reactant gas sources, but are coupled to the same purge gas source. For example, valve 242A is coupled to a reactant gas source 238 and valve 242B is coupled to reactant gas source 239, which both valves 242A, 242B are coupled to purge a gas source 240. Each valve 242A, 242B includes a delivery line 243A, 243B having a valve seat assembly 244A, 244B and includes a purge line 245A, 245B having a valve seat assembly 246A, 246B. The delivery line 243A, 243B is in communication with the reactant gas source 238, 239 and is in communication with the gas inlet 237A, 237B of the expanding channel 290. The valve seat assembly 244A, 244B of the delivery line 243A, 243B controls the flow of the reactant gas from the reactant gas source 238, 239 to the expanding channel 290. The purge line 245A, 245B is in communication with the purge gas source 240 and intersects the delivery line 243A, 243B downstream of the valve seat assembly 244A, 244B of the delivery line 243A, 243B. The valve seat assembly 246A, 246B of the purge line 245A, 245B controls the flow of the purge gas from the purge gas source 240 to the delivery line 243A, 243B. If a carrier gas is used to deliver reactant gases from the reactant gas source 238, 239, the same gas may be used as a carrier gas and a purge gas (i.e., an argon gas may be used as both a carrier gas and a purge gas).

Each valve 242A, 242B may be a zero dead volume valve to enable flushing of a reactant gas from the delivery line 243A, 243B when the valve seat assembly 244A, 244B of the valve is closed. For example, the purge line 245A, 245B may be positioned adjacent the valve seat assembly 244A, 244B of the delivery line 243A, 243B. When the valve seat assembly 244A, 244B is closed, the purge line 245A, 245B may provide a purge gas to flush the delivery line 243A, 243B. In the embodiment shown, the purge line 245A, 245B is positioned as slightly spaced from the valve seat assembly 244A, 244B of the delivery line 243A, 243B so that a purge gas is not directly delivered into the valve seat assembly 244A, 244B when open. A zero dead volume valve as used herein is defined as a valve which has negligible dead volume (i.e., not necessary zero dead volume.) Each valve 242A, 242B may be adapted to provide a combined gas flow and/or separate gas flow of the reactant gas from the sources 238, 239 and the purge gas from the source 240. The pulses of the purge gas may be provided by opening and closing a diaphragm of the valve seat assembly 246A of the purge line 245A. The pulses of the reactant gas from the reactant gas source 238 may be provided by opening and closing the valve seat assembly 244A of the delivery line 243A.

A control unit 280 may be coupled to the chamber 200 to control processing conditions. The control unit 280 comprises a central processing unit (CPU) 282, support circuitry 284, and memory 186 containing associated control software 283. The control unit 280 may be one of any form of general purpose computer processors that can be used in an industrial setting for controlling various chambers and subprocessors. The CPU 282 may use any suitable memory 186, such as random access memory, read only memory, floppy disk drive, compact disc drive, hard disk, or any other form of digital storage, local or remote. Various support circuits may be coupled to the CPU 282 for supporting the chamber 200. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 2. In addition to the control of process gases and purge gases from gas sources 238, 239, 240 and from the programmable logic controllers 248A, 248B of the valves 242A, 242B, the control unit 280 may be configured to be responsible for automated control of other activities used in substrate processing, such as substrate transport, temperature control, chamber evacuation, among other activities, some of which are described elsewhere herein.

Figure 3:
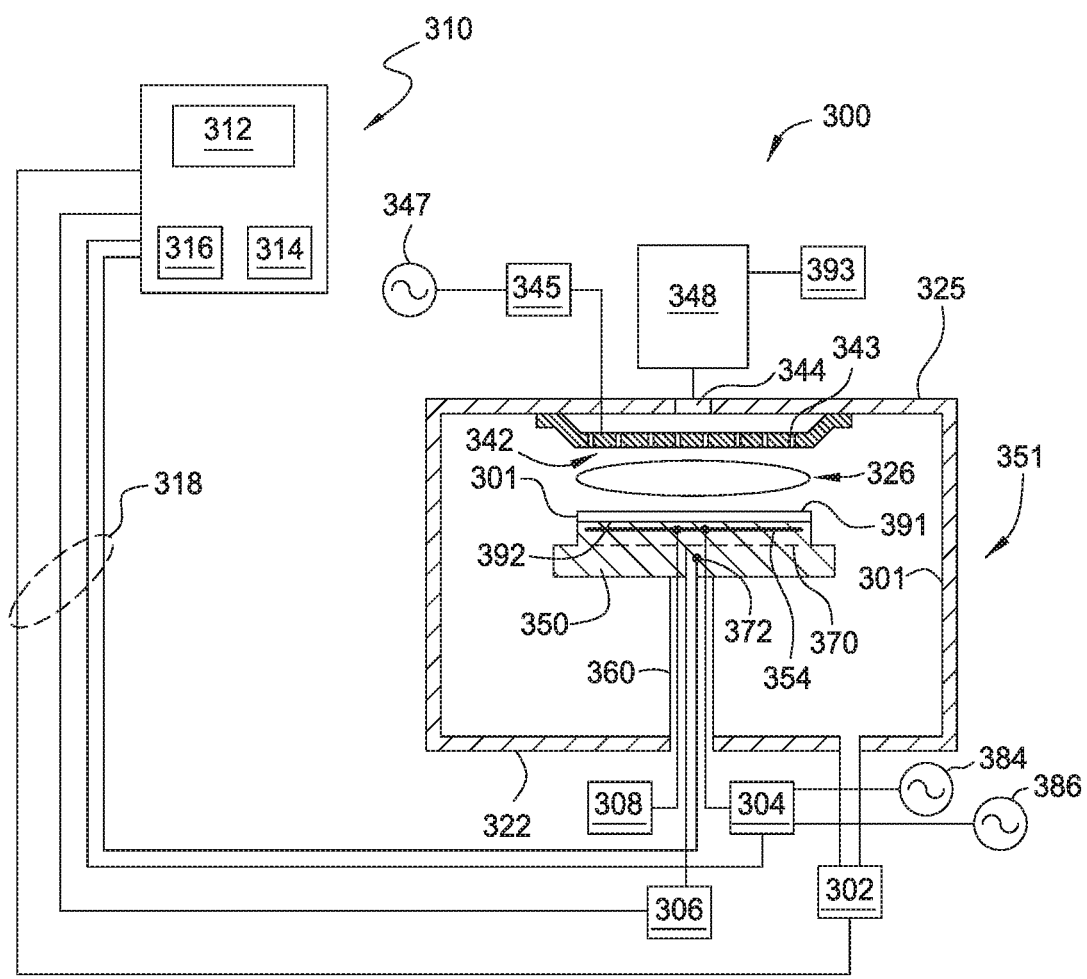
FIG. 3 depicts an apparatus may be utilized to perform an chemical vapor deposition (CVD) processing process in accordance with one embodiment of the present disclosure.

FIG. 3 is a cross sectional view of a processing chamber 300 suitable for performing a plasma deposition process (e.g., a plasma enhanced CVD or a metal organic CVD) that may be utilized as semiconductor interconnection structures for semiconductor devices manufacture. The processing chamber 300 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 300 includes a chamber body 351. The chamber body 351 includes a lid 325, a sidewall 303 and a bottom wall 322 that define an interior volume 326.

A substrate support pedestal 350 is provided in the interior volume 326 of the chamber body 351. The pedestal 350 may be fabricated from aluminum, ceramic, aluminum nitride, and other suitable materials. In one embodiment, the pedestal 350 is fabricated by a ceramic material, such as aluminum nitride, which is a material suitable for use in a high temperature environment, such as a plasma process environment, without causing thermal damage to the pedestal 350. The pedestal 350 may be moved in a vertical direction inside the chamber body 351 using a lift mechanism (not shown).

The pedestal 350 may include an embedded heater element 370 suitable for controlling the temperature of a substrate 301 supported on the pedestal 350. In one embodiment, the pedestal 350 may be resistively heated by applying an electric current from a power supply 306 to the heater element 370. In one embodiment, the heater element 370 may be made of a nickel-chromium wire encapsulated in a nickel-iron-chromium alloy (e.g., INCOLOY®) sheath tube. The electric current supplied from the power supply 306 is regulated by the controller 310 to control the heat generated by the heater element 370, thus maintaining the substrate 301 and the pedestal 350 at a substantially constant temperature during film deposition at any suitable temperature range. In another embodiment, the pedestal may be maintained at room temperature as needed. In yet another embodiment, the pedestal 350 may also include a chiller (not shown) as needed to cool the pedestal 350 at a range lower than room temperature as needed. The supplied electric current may be adjusted to selectively control the temperature of the pedestal 350 between about 20 degrees Celsius to about 700 degrees Celsius.

A temperature sensor 372, such as a thermocouple, may be embedded in the substrate support pedestal 350 to monitor the temperature of the pedestal 350 in a conventional manner. The measured temperature is used by the controller 310 to control the power supplied to the heater element 370 to maintain the substrate at a desired temperature.

The pedestal 350 generally includes a plurality of lift pins (not shown) disposed therethrough that are configured to lift the substrate 301 from the pedestal 350 and facilitate exchange of the substrate 301 with a robot (not shown) in a conventional manner.

The pedestal 350 comprises at least one electrode 392 for retaining the substrate 301 on the pedestal 350. The electrode 392 is driven by a chucking power source 308 to develop an electrostatic force that holds the substrate 301 to the pedestal surface, as is conventionally known. Alternatively, the substrate 301 may be retained to the pedestal 350 by clamping, vacuum or gravity.

In one embodiment, the pedestal 350 is configured as a cathode having the electrode 392 embedded therein coupled to at least one RF bias power source, shown in FIG. 3 as two RF bias power sources 384, 386. Although the example depicted in FIG. 3 shows two RF bias power sources 384, 386, it is noted that the number of the RF bias power sources may be any number as needed. The RF bias power sources 384, 386 are coupled between the electrode 392 disposed in the pedestal 350 and another electrode, such as a gas distribution plate 342 or lid 325 of the processing chamber 300. The RF bias power source 384, 386 excites and sustains a plasma discharge formed from the gases disposed in the processing region of the processing chamber 300.

In the embodiment depicted in FIG. 3, the dual RF bias power sources 384, 386 are coupled to the electrode 392 disposed in the pedestal 350 through a matching circuit 304. The signal generated by the RF bias power source 384, 386 is delivered through matching circuit 304 to the pedestal 350 through a single feed to ionize the gas mixture provided in the processing chamber 300, thereby providing ion energy necessary for performing a deposition or other plasma enhanced process. The RF bias power sources 384, 386 are generally capable of producing an RF signal having a frequency of from about 50 kHz to about 200 MHz and a power between about 0 Watts and about 5000 Watts.

It is noted that in one example depicted herein, the plasma is only turned on when a cleaning process is performed in the processing chamber 300 as needed.

A vacuum pump 302 is coupled to a port formed in the bottom 322 of the chamber body 351. The vacuum pump 302 is used to maintain a desired gas pressure in the chamber body 351. The vacuum pump 302 also evacuates post-processing gases and by-products of the process from the chamber body 351.

The processing chamber 300 includes one or more gas delivery passages 344 coupled through the lid 325 of the processing chamber 300. The gas delivery passages 344 and the vacuum pump 302 are positioned at opposite ends of the processing chamber 300 to induce laminar flow within the interior volume 326 to minimize particulate contamination.

The gas delivery passage 344 is coupled to the gas panel 393 through a remote plasma source (RPS) 348 to provide a gas mixture into the interior volume 326. In one embodiment, the gas mixture supplied through the gas delivery passage 344 may be further delivered through a gas distribution plate 342 disposed below the gas delivery passage 344. In one example, the gas distribution plate 342 having a plurality of apertures 343 is coupled to the lid 325 of the chamber body 351 above the pedestal 350. The apertures 343 of the gas distribution plate 342 are utilized to introduce process gases from the gas panel 393 into the chamber body 351. The apertures 343 may have different sizes, number, distributions, shape, design, and diameters to facilitate the flow of the various process gases for different process requirements. A plasma is formed from the process gas mixture exiting the gas distribution plate 342 to enhance thermal decomposition of the process gases resulting in the deposition of material on the surface 391 of the substrate 301.

The gas distribution plate 342 and substrate support pedestal 350 may be formed a pair of spaced apart electrodes in the interior volume 326. One or more RF sources 347 provide a bias potential through a matching network 345 to the gas distribution plate 342 to facilitate generation of a plasma between the gas distribution plate 342 and the pedestal 350. Alternatively, the RF sources 347 and matching network 345 may be coupled to the gas distribution plate 342, substrate support pedestal 350, or coupled to both the gas distribution plate 342 and the substrate support pedestal 350, or coupled to an antenna (not shown) disposed exterior to the chamber body 351. In one embodiment, the RF sources 347 may provide between about 10 Watts and about 3000 Watts at a frequency of about 30 kHz to about 13.6 MHz. Alternatively, the RF source 347 may be a microwave generator that provide microwave power to the gas distribution plate 342 that assists generation of the plasma in the interior volume 326.

In one embodiment, the remote plasma source (RPS) 348 may be alternatively coupled to the gas delivery passages 344 to assist in forming a plasma from the gases supplied from the gas panel 393 into the in the interior volume 326. The remote plasma source 348 provides plasma formed from the gas mixture provided by the gas panel 393 to the processing chamber 300.

The controller 310 includes a central processing unit (CPU) 312, a memory 316, and a support circuit 314 utilized to control the process sequence and regulate the gas flows from the gas panel 393. The CPU 312 may be of any form of a general purpose computer processor that may be used in an industrial setting. The software routines can be stored in the memory 316, such as random access memory, read only memory, floppy, or hard disk drive, or other form of digital storage. The support circuit 314 is conventionally coupled to the CPU 312 and may include cache, clock circuits, input/output systems, power supplies, and the like. Bi-directional communications between the controller 310 and the various components of the processing chamber 300 are handled through numerous signal cables collectively referred to as signal buses 318, some of which are illustrated in FIG. 3.

Figure 4:
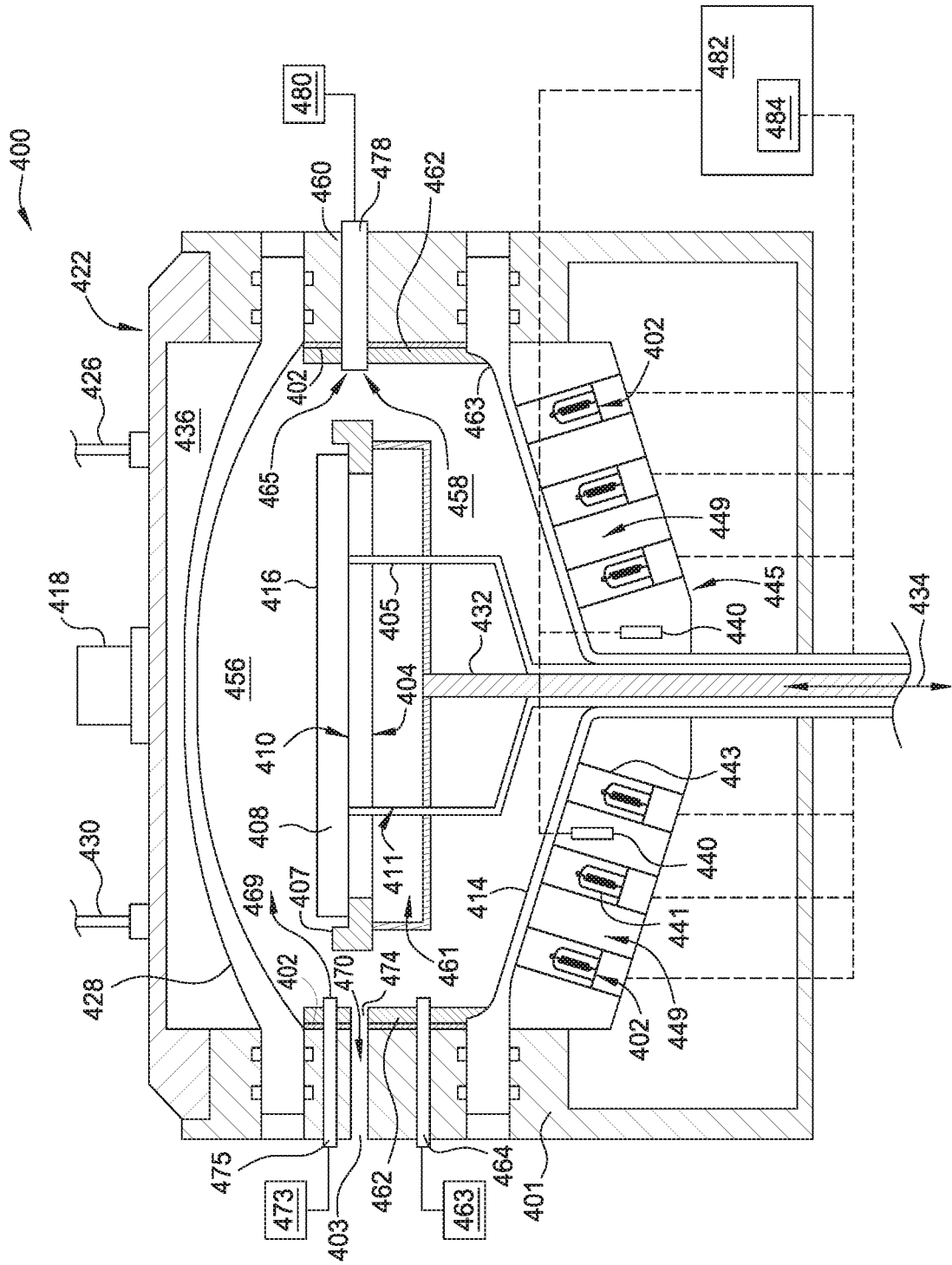
FIG. 4 depicts an apparatus may be utilized to perform an thermal annealing processing process in accordance with one embodiment of the present disclosure.

FIG. 4 is a schematic sectional view of a processing chamber 400 according to one embodiment of the disclosure. The processing chamber 400 may be used to process one or more substrates, including deposition of a material on an upper surface of a substrate, such as an upper surface 416 of a substrate 408 depicted in FIG. 4. The processing chamber 400 includes a chamber body 401 connected to, an upper dome 428 and a lower dome 414. In one embodiment, the upper dome 428 may be fabricated from a material such as a stainless steel, aluminum, or ceramics including quartz, including bubble quartz (e.g., quartz with fluid inclusions), alumina, yttria, or sapphire. The upper dome 428 may also be formed from coated metals or ceramics. The lower dome 414 may be formed from an optically transparent or translucent material such as quartz. The lower dome 414 is coupled to, or is an integral part of, the chamber body 401. The chamber body 401 may include a base plate 460 that supports the upper dome 428.

An array of radiant heating lamps 402 is disposed below the lower dome 414 for heating, among other components, a backside 404 of a substrate support 407 disposed within the processing chamber 400. During deposition, the substrate 408 may be brought into the processing chamber 400 and positioned onto the substrate support 407 through a loading port 403. The lamps 402 are adapted to the heat the substrate 408 to a predetermined temperature to facilitate thermal decomposition of process gases supplied into the processing chamber to deposit a material on onto the upper surface 416 of the substrate 408. The lamps 402 may be adapted to heat the substrate 408 to a temperature of about 300 degrees Celsius to about 1200 degrees Celsius, such as about 300 degrees Celsius to about 950 degrees Celsius.

The lamps 402 may include bulbs 441 surrounded by an optional reflector 443 disposed adjacent to and beneath the lower dome 414 to heat the substrate 408 as the process gas passes thereover to facilitate the deposition of the material onto the upper surface 416 of the substrate 408. The lamps 402 are arranged in annular groups of increasing radius around a shaft 432 of the substrate support 407. The shaft 432 is formed from quartz and contains a hollow portion or cavity therein, which reduces lateral displacement of radiant energy near the center of the substrate 408, thus facilitating uniform irradiation of the substrate 408.

In one embodiment, each lamp 402 is coupled to a power distribution board (not shown) through which power is supplied to each lamp 402. The lamps 402 are positioned within a lamphead 445 which may be cooled during or after processing by, for example, a cooling fluid introduced into channels 449 located between the lamps 402. The lamphead 445 conductively cools the lower dome 414 due in part to the close proximity of the lamphead 445 to the lower dome 414. The lamphead 445 may also cool the lamp walls and walls of the reflectors 443. If desired, the lampheads 445 may be in contact with the lower dome 414.

The substrate support 407 may be moved vertically by an actuator (not shown) to a loading position below the processing position to allow lift pins 405 to contact the lower dome 414. The lift pins 405 pass through holes 411 in the substrate support 407 and raise the substrate 108 from the substrate support 407. A robot (not shown) may then enter the processing chamber 400 to engage and remove the substrate 408 therefrom through the loading port 403. A new substrate is placed on the substrate support 407, which then may be raised to the processing position to place the substrate 408, with upper surface 416 wherein devices mostly formed thereon facing up, in contact with a front side 410 of the substrate support 407.

The substrate support 407 disposed in the processing chamber 400 divides the internal volume of the processing chamber 400 into a process gas region 456 (above the front side 410 of the substrate support 407) and a purge gas region 458 (below the substrate support 407). The substrate support 407 is rotated during processing by a central shaft 432 to minimize the effects of thermal and process gas flow spatial non-uniformities within the processing chamber 400, and thus facilitate uniform processing of the substrate 408. The substrate support 407 is supported by the central shaft 432, which moves the substrate 408 in an up and down direction 434 during loading and unloading, and in some instances, during processing of the substrate 408. The substrate support 407 may be formed from a material having low thermal mass or low heat capacity, so that energy absorbed and emitted by the substrate support 407 is minimized.

In one embodiment, the upper dome 428 and the lower dome 414 are formed from an optically transparent or translucent material such as quartz. The upper dome 428 and the lower dome 414 are thin to minimize thermal memory. In one embodiment, the upper dome 428 and the lower dome 414 may have a thickness between about 3 mm and about 10 mm, for example about 4 mm. The upper dome 428 may be thermally controlled by introducing a thermal control fluid, such as a cooling gas, through an inlet portal 426 into a thermal control space 436, and withdrawing the thermal control fluid through an exit portal 430. In some embodiments, a cooling fluid circulating through the thermal control space 436 may reduce deposition on an inner surface of the upper dome 428.

A liner assembly 462 may be disposed within the chamber body 401 and is surrounded by the inner circumference of the base plate 460. In one embodiment, the liner assembly 462 may be fabricated from an optical transparent or translucent material, such as glass, quartz, including bubble quartz (e.g., quartz with fluid inclusions), sapphire, opaque quartz, and the like. Alternatively, the liner assembly 462 may be fabricated by a metallic material, such as aluminum containing materials if the material is protected from corrosion.

An optical pyrometer 418 may be disposed at a region above the upper dome 428. The optical pyrometer 418 measures a temperature of the upper surface 416 of the substrate 408. In certain embodiments, multiple pyrometers may be used and may be disposed at various locations above the upper dome 428. A reflector 422 may be optionally placed outside the upper dome 428 to reflect infrared light that is radiating from the substrate 108 or transmitted by the substrate 108 back onto the substrate 408. Due to the reflected infrared light, the efficiency of the heating will be improved by containing heat that could otherwise escape the processing chamber 400. The reflector 422 can be made of a metal such as aluminum or stainless steel. The reflector 422 can have the inlet portal 426 and exit portal 430 to carry a flow of a fluid such as water for cooling the reflector 422. If desired, the reflection efficiency can be improved by coating a reflector area with a highly reflective coating, such as a gold coating.

A plurality of thermal radiation sensors 440, which may be pyrometers or light pipes, such as sapphire light pipes, may be disposed in the lamphead 445 for measuring thermal emissions of the substrate 408. The sensors 440 are typically disposed at different locations in the lamphead 445 to facilitate viewing (i.e., sensing) different locations of the substrate 408 during processing. In embodiments using light pipes, the sensors 440 may be disposed on a portion of the chamber body 401 below the lamphead 445. At least two sensors 440 are used, but more than two may be used.

Each sensor 440 views a zone of the substrate 408 and senses the thermal state of that zone. The zone may be oriented radially in some embodiments. For example, in embodiments where the substrate 408 is rotated, the sensors 440 may view, or define, a central zone in a central portion of the substrate 408 having a center substantially the same as the center of the substrate 408, with one or more zones surrounding the central zone and concentric therewith. It is not required that the zones be concentric and radially oriented. In some embodiments, zones may be arranged at different locations of the substrate 408 in non-radial fashion.

Process gas supplied from a process gas supply source 473 is introduced into the process gas region 456 through a process gas inlet port 475 formed in the sidewall of the base plate 460. Removal of the process gas through the gas outlet port 478 may be facilitated by a vacuum pump 480 coupled thereto. Purge gas supplied from a purge gas source 463 is introduced to the purge gas region 458 through a purge gas inlet port 464 formed in the sidewall of the base plate 460. The purge gas inlet port 464 is disposed at an elevation below the process gas inlet port 475. The purge gas inlet port 464 is configured to direct the purge gas in a generally radially inward direction. If desired, the purge gas inlet port 464 may be configured to direct the purge gas in an upward direction. During the film formation process, the substrate support 407 is located at a position such that the purge gas flows along flow path 461 across a back side 404 of the substrate support 407. Without being bound by any particular theory, the flowing of the purge gas is believed to prevent or substantially avoid the flow of the process gas from entering into the purge gas region 458, or to reduce diffusion of the process gas entering the purge gas region 458 (i.e., the region under the substrate support 407). The purge gas exits the purge gas region 458 (along flow path 466) and is exhausted out of the process chamber through the gas outlet port 478 located on the opposite side of the processing chamber 400 relative to the purge gas inlet port 464.

During processing, a controller 482 receives data from the sensors 440 and separately adjusts the power delivered to each lamp 402, or individual groups of lamps or lamp zones, based on the data. The controller 482 may include a power supply 484 that independently powers the various lamps 402 or lamp zones. The controller 482 can be configured to produce a desired temperature profile on the substrate 408, and based on comparing the data received from the sensors 440, the controller 482 may adjust the power to lamps and/or lamp zones to conform the observed (i.e., sensed) thermal data indicating of the lateral temperature profile of the substrate with to the desired temperature profile. The controller 482 may also adjust power to the lamps and/or lamp zones to conform the thermal treatment of one substrate to the thermal treatment of another substrate, to prevent chamber performance drift over time.

Figure 5:
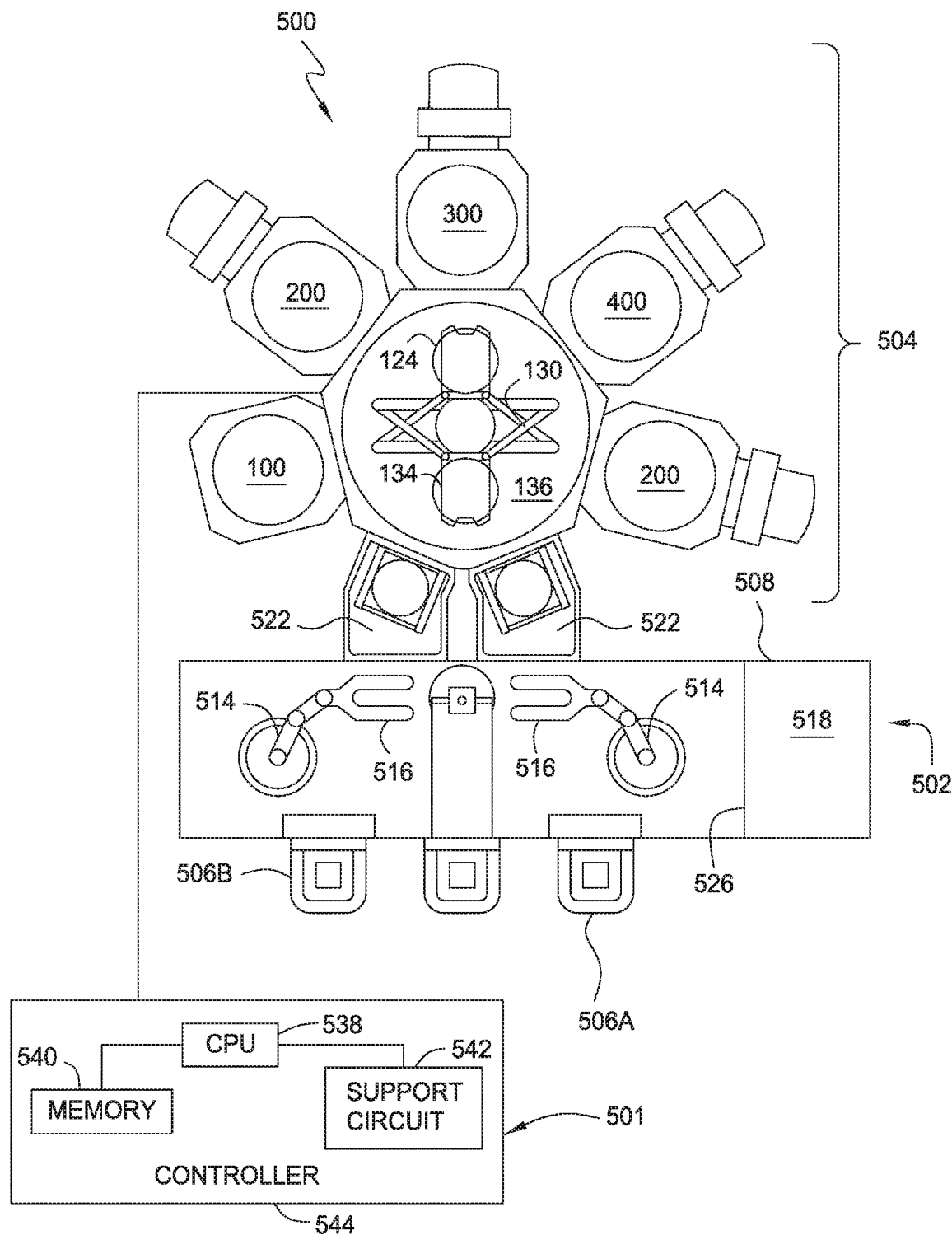
FIG. 5 depicts one embodiment of a cluster processing system that may have the processing chambers from FIGS. 1-4 to be incorporated thereto for practice one embodiment of the present disclosure.

FIG. 5 is a schematic, top plan view of an exemplary cluster processing system 500 that includes one or more of the processing chambers 100, 200, 300, 400 that are incorporated and integrated therein. In one embodiment, the cluster processing system 500 may be a Centura® or Endura® integrated processing system, commercially available from Applied Materials, Inc., located in Santa Clara, Calif. It is contemplated that other processing systems (including those from other manufacturers) may be adapted to benefit from the disclosure.

The cluster processing system 500 includes a vacuum-tight processing platform 504, a factory interface 502, and a system controller 544. The platform 504 includes a plurality of processing chambers 100, 200, 300, 400 and at least one load-lock chamber 522 that is coupled to a vacuum substrate transfer chamber 536. Two load lock chambers 522 are shown in FIG. 5. The factory interface 502 is coupled to the transfer chamber 536 by the load lock chambers 522.

In one embodiment, the factory interface 502 comprises at least one docking station 508 and at least one factory interface robot 514 to facilitate transfer of substrates. The docking station 508 is configured to accept one or more front opening unified pod (FOUP). Two FOUPS 506A-B are shown in the embodiment of FIG. 5. The factory interface robot 514 having a blade 516 disposed on one end of the robot 514 is configured to transfer the substrate from the factory interface 502 to the processing platform 504 for processing through the load lock chambers 522. Optionally, one or more metrology stations 518 may be connected to a terminal 526 of the factory interface 502 to facilitate measurement of the substrate from the FOUPS 506A-B.

Each of the load lock chambers 522 have a first port coupled to the factory interface 502 and a second port coupled to the transfer chamber 536. The load lock chambers 522 are coupled to a pressure control system (not shown) which pumps down and vents the load lock chambers 522 to facilitate passing the substrate between the vacuum environment of the transfer chamber 536 and the substantially ambient (e.g., atmospheric) environment of the factory interface 502.

The transfer chamber 536 has a vacuum robot 530 disposed therein. The vacuum robot 530 has a blade 534 capable of transferring substrates 524 among the load lock chambers 522, the metrology system 510 and the processing chambers 100, 200, 300, 400.

In one embodiment of the cluster processing system 500, the cluster processing system 500 may include one or more processing chambers 100, 200, 300, 400, which may be a deposition chamber (e.g., physical vapor deposition chamber, chemical vapor deposition, atomic layer deposition or other deposition chambers), annealing chamber (e.g., high pressure annealing chamber, RTP chamber, laser anneal chamber), etch chamber, cleaning chamber, pre-cleaning chamber, curing chamber, lithographic exposure chamber, or other similar type of semiconductor processing chambers. In some embodiments of the cluster processing system 500, one or more of processing chambers 100, 200, 300, 400, the transfer chamber 536, the factory interface 502 and/or at least one of the load lock chambers 522.

The system controller 544 is coupled to the cluster processing system 500. The system controller 544, which may include the computing device 501 or be included within the computing device 501, controls the operation of the cluster processing system 500 using a direct control of the process chambers 100, 200, 300, 400 of the cluster processing system 500. Alternatively, the system controller 544 may control the computers (or controllers) associated with the process chambers 100, 200, 300, 400 and the cluster processing system 500. In operation, the system controller 544 also enables data collection and feedback from the respective chambers to optimize performance of the cluster processing system 500.

The system controller 544, much like the computing device 501 described above, generally includes a central processing unit (CPU) 538, a memory 540, and support circuits 542. The CPU 538 may be one of any form of a general purpose computer processor that can be used in an industrial setting. The support circuits 542 are conventionally coupled to the CPU 538 and may comprise cache, clock circuits, input/output subsystems, power supplies, and the like. The software routines transform the CPU 538 into a specific purpose computer (controller) 544. The software routines may also be stored and/or executed by a second controller (not shown) that is located remotely from the cluster processing system 500.

Figure 6:
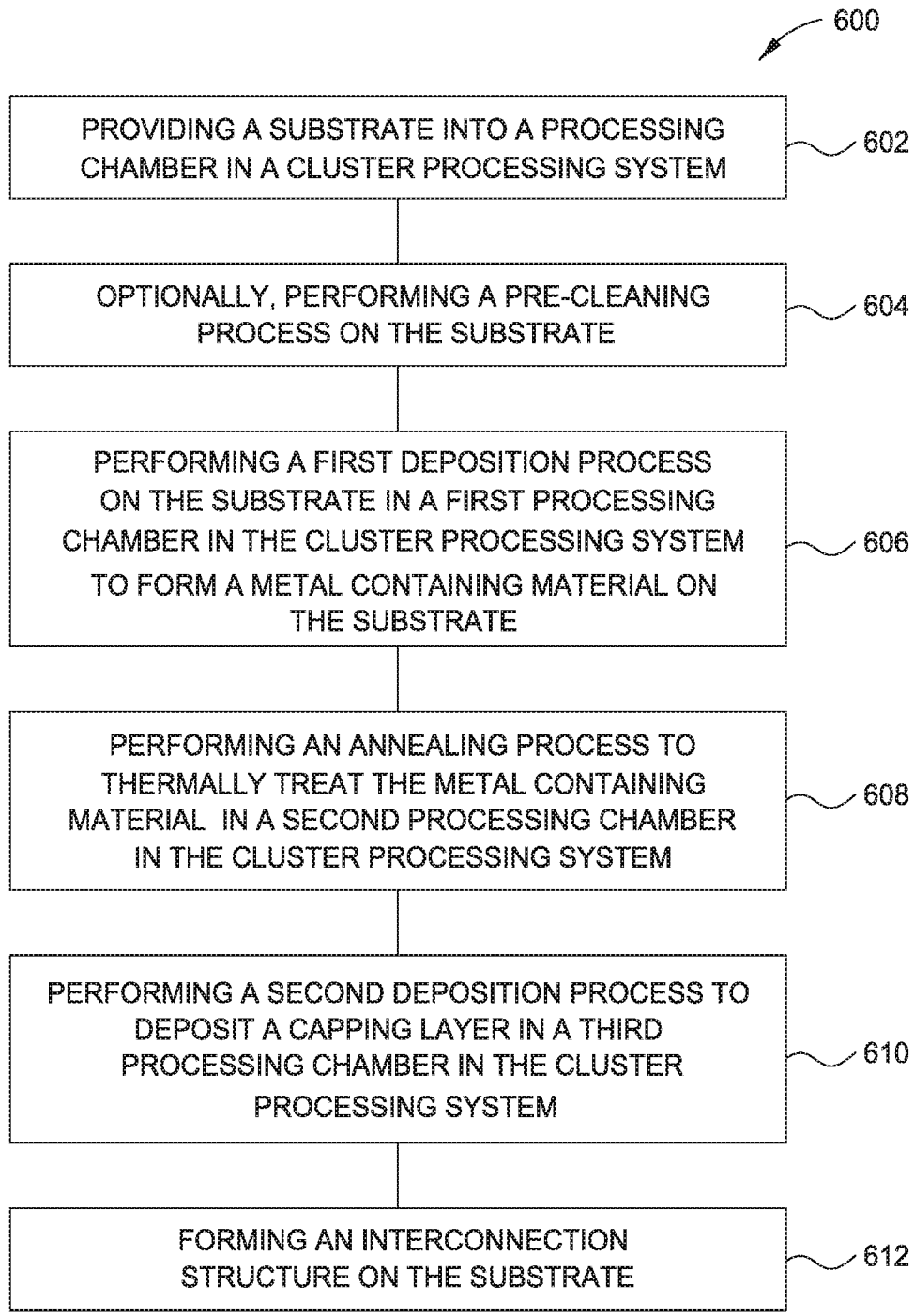
FIG. 6 depicts a flow diagram of an example of a method for forming a metal containing material on a substrate.

FIG. 6 is a flow diagram of one example of forming a metal containing material having a capping protection structure on the metal containing material for semiconductor structure. The structure may be any suitable structures formed on a semiconductor substrate, such as a device or a channel structure with conductive and non-conductive areas, a fin structure, a gate structure, a contact structure, a front-end structure, a back-end structure or any other suitable structures utilized in semiconductor applications. FIGS. 7A-7D are schematic cross-sectional views of a portion of a substrate 702 corresponding to various stages of the process 600. The process 600 may be utilized to a channel structure both conductive and non-conductive areas formed on a substrate so as to form desired materials formed on different locations of the interconnection structure.

Figure 7A:
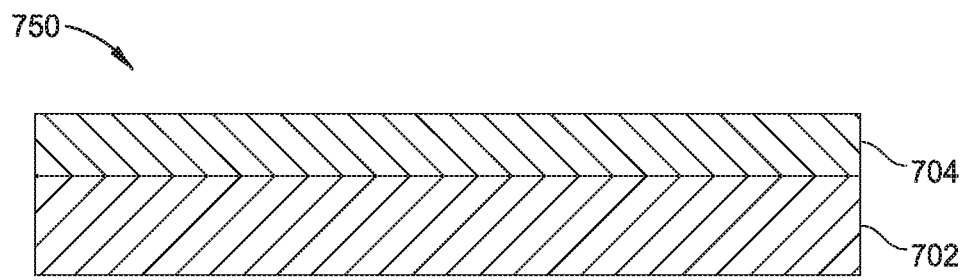
FIGS. 7A-7D depict one embodiment of a sequence for forming a metal containing material on the substrate during the manufacturing process according to the process depicted in FIG. 6.

The process 600 begins at operation 602 by providing a substrate, such as the substrate 702 as shown in FIG. 7A for processing. In one embodiment, the substrate 702 may have a device structure 750 to be formed on the substrate 702. The substrate 702 may have a substantially planar surface, an uneven surface, or a substantially planar surface having a structure formed thereon. The substrate 702 shown in FIG. 7A includes a structure or a material layer 704 formed on the substrate 702. The structure or the material layer 704 may be any suitable structures, such as a gate structure, a contact structure, an interconnection structure or just a blanket layer formed on the substrate 702 as needed. In one embodiment, the substrate 702 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 702 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

At operation 604, the substrate 702 is then transferred to the processing chamber into the processing chamber, such as the pre-cleaning chamber 100 as depicted in FIG. 1, which may be incorporated into the cluster processing system 500 depicted in FIG. 5, to perform a pre-cleaning process on the substrate 702. It is noted that the pre-cleaning process at operation 604 is optional based on the substrate surface conditions. In some embodiments, the pre-cleaning process performed at operation 604 may assist removing surface contaminations or surface native oxide from the substrate surface. In some embodiment, the pre-cleaning process may not be necessary.

In one example, the pre-cleaning process may be performed by supplying a pre-cleaning gas mixture including hydrogen etchants. The pre-cleaning gas mixture includes at least a hydrogen containing gas. While supplying the hydrogen containing gas in the pre-cleaning gas mixture, an inert gas may also be optionally supplied during the pre-cleaning process. Suitable examples of the hydrogen containing gas include $H_2$, $H_2O$, $H_2O_2$, and the like. Suitable examples of the inert gas may also be supplied into the pre-cleaning gas mixture as needed. Examples of the inert gas supplied in the gas mixture include Ar, He, Ne, Kr, Xe and the like. In one particular example, the pre-cleaning gas mixture includes $H_2$.

The pre-cleaning gas mixture is supplied through the chamber plasma region 121 into the substrate processing region 141 to form a remote plasma source in the chamber plasma region 121 from the pre-cleaning gas mixture for removing surface contaminants and native oxide. The amount of gases introduced into the processing chamber 100 from the pre-cleaning gas mixture may be varied and adjusted to accommodate, for example, the thickness of the native oxide or the amount of the surface contaminates to be removed.

A remote plasma power from the power source 152 is generated to form a plasma in the chamber plasma region 121 from the pre-cleaning gas mixture supplied at operation 604. The plasma generated remotely in the chamber plasma region 121 during the pre-cleaning process at operation 604 may have the etchants dissociated to form a relatively mild and gentle etchants, so as to slowly, gently and gradually etch the surface contaminants and native oxide, e.g., an isotropic etching process. The remote plasma process provides good control for the interface cleaning and promotes high etching selectivity.

Figure 7B:
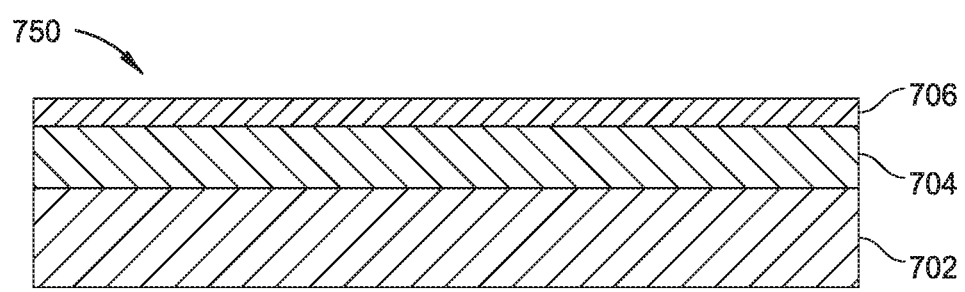

At operation 606, a first deposition process is performed to form a transition metal containing material 706 on the material layer 704 on the substrate 702, as recited by FIG. 7B. The deposition process may be an ALD process performed at the ALD processing chamber 200 depicted in FIG. 2, or a CVD process performed at the CVD processing chamber 400 depicted in FIG. 4, or other suitable processing chambers incorporated in the cluster processing system 500. In one embodiment, the transition metal containing material 706 is a two-dimensional transition metal dichalcogenide layer. The transition metal containing material 706 may be formed in crystalline state or amorphous state. The two-dimensional crystalline or amorphous transition metal dichalcogenide layer 706 has a thickness from 0.5 nm to 100 nm. The two-dimensional crystalline or amorphous transition metal dichalcogenide layer 706 has a formula of $MX_2$, wherein M comprises molybdenum (Mo) or tungsten (W) and X comprises sulfur (S), selenium (Se), or tellurium (Te). Suitable examples of the two-dimensional transition metal dichalcogenide layer 706 include $MoS_2$, $WS_2$, $MoSe_2$, $WSe_2$ and the like.

In one embodiment, deposition process may be performed by supplying a deposition gas mixture including a metal containing precursor into the processing chamber. Suitable examples of the metal containing precursor include $Mo(NMe_2)_4$, $MoCl_5$, $MoF_6$, tetramethylheptane-3,5-dionato $(Mo(thd)_3)$, $Mo(CO)_6$, $WF_6$, $W_2(NMe_2)_6$, and the like. Some reacting gases may also be supplied in the deposition gas mixture. Suitable examples of the reacting gases include $H_2S$, $H_2Se$, 1,2-ethanedithiol, dimethyldisulfide, diethyldisulfide, diethylsulfide and the like. Other purge gas, and/or dilution gas, such as Ar, He, $N_2$, $N_2O$, $NO_2$, $NH_3$ may also be supplied with the deposition gas mixture as needed. In an example wherein the deposition process is a MOCVD process, the deposition gas mixture includes $Mo(CO)_6$ and $H_2S$ or diethylsulfide gas.

In one exemplary embodiment, a process pressure is regulated between about 10 mTorr to about 5000 mTorr, such as between about 400 mTorr and about 2000 mTorr. A RF source power or a RF bias power may or may not be supplied with the silicon containing gas. A substrate temperature is maintained between about 25 degrees Celsius to about 450 degrees Celsius.

Figure 7C:
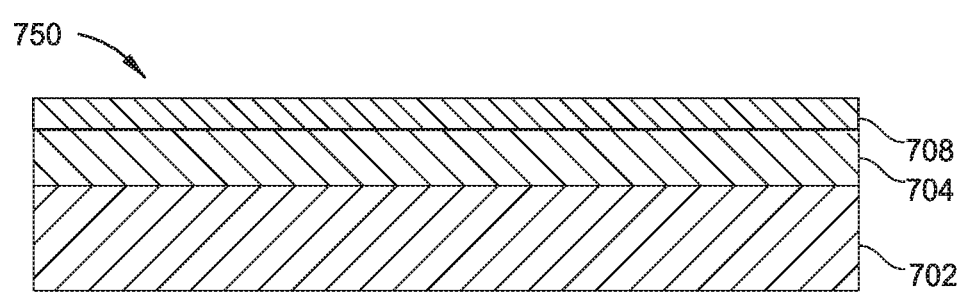

At operation 608, a thermal annealing process is then performed on the substrate 702 to thermally treat the substrate 702, forming a treated metal layer 708, as shown in FIG. 7C. The thermal annealing process may be performed in a processing chamber, such as the thermal processing chamber 400 depicted in FIG. 4, which is incorporated in the cluster processing system 500 depicted in FIG. 5. The thermal annealing process is performed to repair, densify and enhance lattice structures of the two-dimensional transition metal dichalcogenide layer 706. For example, after the thermal/annealing process, the two-dimensional metal dichalcogenide layer 706 may have stronger or sharper (100) or (110) plane peaks under XRD analysis compared to, e.g., without, the thermal/annealing process, thus enhancing crystallinity of two-dimensional transition metal dichalcogenide layer 706. The thermal annealing process may also be performed to modify the composition of the two-dimensional metal dichalcogenide layer 706 by removing impurities or adding or removing chalcogenide to form the desired $MX_2$ stoichiometry.

The thermal annealing process may be performed in a thermal annealing chamber, such as the processing chamber 400 depicted in FIG. 4. Alternatively, the annealing process may be performed in any processing chamber configured to provide enough thermal energy to the two-dimensional transition metal dichalcogenide layer 706 disposed on the substrate 702. The thermal annealing process may heat the substrate 702 to a temperature greater than 400 degrees Celsius, such as between about 600 degrees Celsius and about 1500 degree Celsius, for example between about 800 degrees Celsius and about 1200 degrees Celsius, to recrystallization of the two-dimensional transition metal dichalcogenide layer 706.

During annealing, an annealing gas mixture may be supplied. Gases that may be supplied in the annealing gas mixture may include a nitrogen containing gas, such as $NH_3$, $N_2$, and the like, an inert gas, such as Ar, He, Ne, Kr, Xe or the like, or a sulfur containing gas, such as $H_2S$, diethylsulfide, diethyldisulfide, elemental sulfur and the like, or a selenium containing gas such as $H_2Se$.

After the thermal annealing process, the two-dimensional transition metal dichalcogenide layer 706 may be turned into the treated metal layer 708 with a desired degree of crystallization, as shown in FIG. 7C, having crystal orientation mostly in one plane, such as (001) plane. The thermal energy provides during the thermal annealing process assists crystallizing the two-dimensional transition metal dichalcogenide layer 706 from amorphous state into crystalline state or enhancing the crystallizing the two-dimensional transition metal dichalcogenide layer 706 (e.g., enlarging the grain sizes , fewer grain boundaries, or better alignment of the crystal to the substrate and the like), thus efficiency enhancing electric performance of the two-dimensional transition metal dichalcogenide layer 706. The thermal energy provided during the thermal annealing process at operation 608 assist growing the grains from the amorphous state into large sizes into crystallized grains, enhancing crystallinity of the two-dimensional transition metal dichalcogenide layer 706.

In some examples, the thermal annealing process performed at operation 608 may be a rapid thermal annealing process, laser annealing process, furnace annealing process or any suitable thermal annealing process as needed.

Figure 7D:
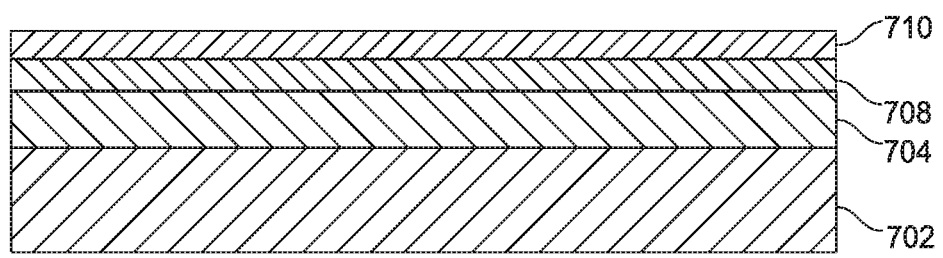

At operation 610, after the thermal annealing process, a capping layer 710 may be optionally and selectively formed on the treated metal layer 708, as shown in FIG. 7D. The capping layer 710 may also be a metal containing layer formed by an ALD process performed at the ALD processing chamber 200 depicted in FIG. 2, or a CVD process performed at the CVD processing chamber 400 depicted in FIG. 4, which both are incorporated in the cluster processing system 500 depicted in FIG. 5.

In one example, the capping layer 710 may cap the treated metal layer 708 to reduce likelihood of the metal elements from being out-diffused in the following processing cycles or from surface oxidation, thus reducing the likelihood of electron migration or other device failure. The capping layer 710 is selected to be fabricated from a material having a relatively good interface blocking property to prevent the metal elements from the treated metal layer 708 from diffusing outward to the nearby insulating materials or from surface oxidation, once the substrate 702 is transferred out from the cluster processing system 500 and exposed to air. In one embodiment, the capping layer 710 may be a metal containing layer, such as cobalt containing materials, tungsten containing materials, nickel containing materials, aluminum containing materials, ruthenium containing materials, molybdaenum containing material, or manganese containing materials. In another example, the capping layer 710 may be dielectric materials, such as SiN, $SiO_2$, SiON, SiC, SiOC, $HfO_2$, $ZrO_2$, $Al_2O_3$, and the like. In one embodiment, the capping layer 710 is a SiN, $SiO_2$, or $HfO_2$.

In one example, the capping layer 710 is formed by a cyclical layer deposition (CLD), atomic layer deposition (ALD), chemical vapor deposition (CVD), a thermal CVD process, a pulsed-CVD process, a PE-CVD process, a pulsed PE-CVD process, or a thermal ALD process.

It is noted that the two-dimensional transition metal dichalcogenide layer 706, the treated metal layer 708 and the capping layer 710 may be in-situ deposited and completed in one cluster processing system, such as the cluster processing system 500 depicted in FIG. 5. In some examples, one of the processes of the capping layer deposition or the annealing process may be ex-situ deposited in different processing chambers of a multi-chamber processing system as needed. In-situ formation of the two-dimensional transition metal dichalcogenide layer 706, the treated metal layer 708 and the capping layer 710 can reduce likelihood of surface oxidation and contamination in the metal device structure so as to enhance electrical performance of the device as well as reduce manufacturing cycle time and cost.

Thus, a method and an apparatus for forming a metal containing material with capping protection for a device structure, such as a channel structure, are provided. The capping layer along with a metal containing material and the thermal treatment thereof in one cluster processing system without breaking vacuum may efficiently protect the metal line from out-diffusion and surface contamination, thus eliminating likelihood of electron migration or current leakage and maintaining a good interface control. By utilizing a proper capping protection and thermal treatment on a metal containing material for a device structure integratedly formed in a cluster processing chamber, the metal device structure may be controlled with desired electrical properties and surface protection, thus increasing the device performance.

While the foregoing is directed to embodiments of the present disclosure, other and further embodiments of the disclosure can be devised without departing from the basic scope thereof, and the scope thereof is determined by the claims that follow.

What is claimed is:

1. A method for a device structure for semiconductor devices, comprising:
    forming a film from a two-dimensional transition metal dichalcogenide and a process gas from a group consisting of 1,2-ethanedithiol, dimethyldisulfide, diethyldisulfide, and diethylsulfide, wherein the film is formed on a substrate in a first processing chamber disposed in a cluster processing system;
    thermally treating the film to form a treated metal layer in a second processing chamber disposed in the cluster processing system, wherein the thermal treatment removes carbon from the film leaving only sulfur from the process gas and metal from a metal precursor to form a $MX_2$ compound, wherein M comprises molybdenum (Mo) or tungsten (W) and X comprises sulfur (S); and
    forming a capping layer on the $MX_2$ compound in a third processing chamber disposed in the cluster processing system.

2. The method of claim 1, wherein the two-dimensional transition metal dichalcogenide is at least one of $MoS_2$, and $WS_2$.

3. The method of claim 1, wherein the two-dimensional transition metal dichalcogenide is formed from an atomic layer deposition process.

4. The method of claim 1, wherein the capping layer is formed from a chemical vapor deposition process.

5. The method of claim 1, wherein the capping layer is at least one of SiN, $SiO_2$, SiON, SiC, SiOC, $HfO_2$, $ZrO_2$ and $Al_2O_3$.

6. The method of claim 1, wherein thermally treating the film further comprises:
    maintaining a substrate temperature between about 600 degrees Celsius and about 1500 degree Celsius.

7. The method of claim 1, wherein forming the film further comprises:
    supplying a deposition gas mixture including a metal containing precursor and a reacting gas, wherein the metal containing precursor is selected from a group consisting of $Mo(NMe_2)_4$, $MoCl_5$, $MoF_6$, tetramethylheptane-3,5-dionato $(Mo(thd)_3)$, $Mo(CO)_6$, $WF_6$ and $W_2(NMe_2)_6$.

8. The method of claim 7, wherein the deposition gas mixture includes $Mo(CO)_6$ and $H_2S$ or diethylsulfide.

9. The method of claim 1, wherein thermally treating the film further comprises:
    converting the two-dimensional transition metal dichalcogenide to a crystalline state.

10. The method of claim 1, further comprising:
    pre-cleaning the substrate in a pre-cleaning chamber incorporated in the cluster processing system prior to forming the organic film.

11. The method of claim 10, wherein the substrate is pre-cleaned by a remote plasma source generated from a hydrogen containing gas mixture in the pre-cleaning chamber.

12. The method of claim 1, wherein the treated metal layer and the capping layer are formed in the cluster processing chamber without breaking vacuum.

13. The method of claim 1, wherein the capping layer is at least one of SiN, $SiO_2$ and $HfO_2$.

* * * * *